US009606339B2

(12) United States Patent
Hetzler et al.

(10) Patent No.: US 9,606,339 B2
(45) Date of Patent: Mar. 28, 2017

(54) MIRROR OF A PROJECTION EXPOSURE APPARATUS FOR MICROLITHOGRAPHY WITH MIRROR SURFACES ON DIFFERENT MIRROR SIDES, AND PROJECTION EXPOSURE APPARATUS (75) Inventors: Jochen Hetzler, Aalen (DE); Ralf Mueller, Aalen (DE); Wolfgang Singer, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 564 days.

(21) Appl. No.: 13/367,116

(22) Filed: Feb. 6, 2012

(65) Prior Publication Data

US 2012/0224186 A1 Sep. 6, 2012

Related U.S. Application Data (63) Continuation of application No. PCT/EP2010/061148, filed on Jul. 30, 2010.

(30) Foreign Application Priority Data

Aug. 7, 2009 (DE) .................. 10 2009 036 484

(51) Int. Cl.
*G01B 9/02* (2006.01)
*G02B 17/06* (2006.01)
(Continued)

(52) U.S. Cl.
CPC ....... *G02B 17/0647* (2013.01); *G02B 13/143* (2013.01); *G03F 7/70233* (2013.01); *G03F 7/70958* (2013.01)

(58) Field of Classification Search
CPC ........ G01M 11/0271; G01J 2009/0292; G01B 2290/25; G01B 11/0675; G01B 11/14
(Continued)

(56) References Cited

U.S. PATENT DOCUMENTS 6,118,577 A 9/2000 Sweatt et al.
6,151,114 A * 11/2000 Russell .................. 356/519
(Continued)

FOREIGN PATENT DOCUMENTS

CN 101088039 A 12/2007
DE 10 2004 008 824 A1 9/2005
(Continued)

OTHER PUBLICATIONS

Mantel K., et al., "Simultaneous characterization of the quality and orientation of cylindrical lens surfaces", Applied Optics, Vo. 44, No. 15, May 20, 2005, pp. 2970-2977.
(Continued)

*Primary Examiner* — Hwa Lee
(74) *Attorney, Agent, or Firm* — Edell, Shapiro & Finnan, LLC (57) ABSTRACT A mirror (M) of a projection exposure apparatus for microlithography configured for structured exposure of a light-sensitive material and a method for producing a mirror (M). The mirror (M) has a substrate body (B), a first mirror surface (S) and a second mirror surface (S'). The first mirror surface (S) is formed on a first side (VS) of the substrate body (B). The second mirror surface (S') is formed on a second side (RS) of the substrate body (B), the second side being different from the first side of the substrate body (B). The mirror (M) may be embodied, in particular, such that the substrate body (B) is produced from a glass ceramic material.

3 Claims, 5 Drawing Sheets (51) Int. Cl.
*G02B 13/14* (2006.01)
*G03F 7/20* (2006.01)

(58) Field of Classification Search
USPC .......................................................... 356/519
See application file for complete search history.

(56) References Cited

U.S. PATENT DOCUMENTS

| | | |
|---|---|---|
| 6,753,947 B2 | 6/2004 | Meisburger et al. |
| 7,411,656 B2 | 8/2008 | Totzeck et al. |
| 7,639,921 B2 | 12/2009 | Seo et al. |
| 2002/0011573 A1* | 1/2002 | Van Dijsseldonk et al. .......... 250/492.22 |
| 2003/0147139 A1 | 8/2003 | Kandaka et al. |
| 2003/0215053 A1 | 11/2003 | Ichihara |
| 2004/0160582 A1 | 8/2004 | Lof et al. |
| 2005/0180011 A1 | 8/2005 | Mann et al. |
| 2005/0197242 A1 | 9/2005 | Mitra et al. |
| 2005/0254120 A1 | 11/2005 | Zaczek |
| 2006/0232867 A1* | 10/2006 | Mann et al. .................. 359/858 |
| 2007/0246156 A1 | 10/2007 | Kohlmann et al. |
| 2009/0002663 A1 | 1/2009 | Freimann et al. |
| 2009/0128896 A1 | 5/2009 | Dodoc |
| 2009/0274011 A1 | 11/2009 | Fujisawa |

FOREIGN PATENT DOCUMENTS

| | | |
|---|---|---|
| DE | 10 2005 042 005 A1 | 7/2006 |
| JP | 63111500 A | 7/1994 |
| JP | 2002522898 A | 7/2002 |
| JP | 2002311198 A | 10/2002 |
| JP | 2004289127 A | 10/2004 |
| JP | 2005231994 A | 9/2005 |
| JP | 2006506772 A | 2/2006 |
| JP | 2007235476 A | 9/2007 |
| JP | 2008514971 A | 5/2008 |
| JP | 2008520084 A | 6/2008 |
| JP | 2008152507 A | 7/2008 |
| JP | 2008529094 A | 7/2008 |
| JP | 200910174 A | 1/2009 |
| WO | 02084671 A1 | 10/2002 |
| WO | 03016977 A2 | 2/2003 |
| WO | 2006069725 A1 | 7/2006 |

OTHER PUBLICATIONS

Nuerge, H., "Interferometrisches Verfahren zur Pruefung von Planplatten und Zylinderlinsen in streifender Inzidenz", May 3, 2000, pp. 7-11, 30-80.
English language translation of Office Action in corresponding Chinese Application No. 201080045368X, mailed Jul. 7, 2014.
Office Action in corresponding Japanese Application No. 2012-523302, mailed Feb. 19, 2014, along with an English translation.
Office Action in corresponding Taiwanese Application No. 99126311, mailed Jul. 6, along with an English translation.

* cited by examiner

MIRROR OF A PROJECTION EXPOSURE APPARATUS FOR MICROLITHOGRAPHY WITH MIRROR SURFACES ON DIFFERENT MIRROR SIDES, AND PROJECTION EXPOSURE APPARATUS

This is a Continuation of International Application PCT/EP2010/061148, with an international filing date of Jul. 30, 2010, which was published under PCT Article 21(2) in English, which claims priority to German Patent Application No. 10 2009 036 484.6, with a filing date of Aug. 7, 2009. The entire contents of both these earlier applications are hereby incorporated by reference into the present application.

FIELD AND BACKGROUND OF THE INVENTION

The invention relates to a method for producing a mirror having at least two mirror surfaces. Furthermore, the invention relates to a mirror of a projection exposure apparatus for microlithography and to a projection exposure apparatus comprising such a mirror.

A projection exposure apparatus for microlithography is usually subdivided into an illumination system and a projection objective. The illumination system produces a desired light distribution for illuminating a pattern of a mask or a reticle. The illuminated pattern is then imaged with extremely high resolution by the projection objective onto a light-sensitive material, and the light-sensitive material is thereby exposed in a manner structured with the pattern. On the basis of the pattern exposed into the light-sensitive material, real structures can be produced in a semiconductor material with the aid of subsequent work steps.

Both the illumination system and the projection objective generally have a multiplicity of optical elements such as, for example, lenses and/or mirrors. In the case of projection exposure apparatus designed for operation at very short wavelengths, for example at a wavelength of less than 100 nm, it becomes necessary to use only mirrors, because no materials are available which have a sufficiently high and at the same time sufficiently homogeneous transmission at those wavelengths, and, therefore, no lenses can be produced for these wavelengths with sufficient quality. The wavelength range below approximately 100 nm is also referred to as the extreme ultraviolet, abbreviated to EUV. Lithography systems that operate in the EUV range are often designed for an operating wavelength of 13.6 nm. Depending on the availability of light sources and optical elements, however, other operating wavelengths can also be used.

In order to enable the pattern to be exposed into the light-sensitive material with high precision, it is necessary for the mirrors used in the projection exposure apparatus to be produced and oriented relative to one another with high precision. Moreover, care must be taken to ensure that, during the operation of the projection exposure apparatus, there is a departure from the precise shaping and the precise orientation of the mirrors only within a permissible tolerance. For these reasons, the mirrors in many cases have a very solid substrate body, which imparts a high mechanical stability to the mirrors. However, as a result of this solid embodiment and the associated large external dimensions of the mirrors, problems with regard to structural space can occur, particularly if the underlying optical design of the projection exposure apparatus requires an arrangement of two mirrors at a small distance back to back with respect to one another.

In this context, DE 10 2005 042 005 A1 discloses, in the case of a high-aperture projection objective for microlithography having an obscured pupil, embodying one mirror as a double mirror in which a respective mirror surface is arranged on a front side and a rear side of a substrate.

However, the misorientations between the two mirror surfaces that arise when a double mirror is manufactured using conventional manufacturing and measuring methods, on account of the accompanying imaging aberrations, require an extensive correction using further mirrors or other optical elements of the projection objective. This can lead to problems particularly when the number of optical elements present is comparatively small and the correction possibilities are thus very limited.

A further problem is that, in known methods for measuring the misorientation between two optical surfaces, for example the two optical surfaces of a lens, the measurement is generally effected through the substrate body. Therefore, for a precise measurement result, stringent requirements have to be made of the substrate body. In the case of a lens, this generally does not cause an additional outlay, since the light used for the exposure also passes through the substrate body and said lens already has to have a high optical quality for this reason. By contrast, in the case of a mirror, the imaging properties of which are characterized by its surface and not by the volume properties of its substrate body, a substrate body which is suitable for a precise measurement in transmission causes a considerable additional outlay and, moreover, results in a significant restriction to the suitable materials.

OBJECTS AND SUMMARY OF THE INVENTION

One object of the invention is to embody a mirror of a projection exposure apparatus for microlithography such that problems with regard to structural space are avoided and precise exposure of a pattern into a light-sensitive material is possible with the projection exposure apparatus.

According to one formulation of the invention, a mirror of a projection exposure apparatus for microlithography for the structured exposure of a light-sensitive material has a substrate body, a first mirror surface and a second mirror surface. The first mirror surface is formed on a first side of the substrate body. The second mirror surface is formed on a second side of the substrate body, the second side being different from the first side of the substrate body. The substrate body is produced from a glass ceramic material.

This mirror has the advantage that it can be embodied very compactly and accordingly requires a comparatively small structural space in the projection exposure apparatus. A further advantage is that glass ceramic materials are available which have a very low coefficient of thermal expansion, such that the form and the position of the mirror surfaces are maintained virtually unchanged even in the case of temperature changes.

The invention furthermore relates to a mirror of a projection exposure apparatus for microlithography for the structured exposure of a light-sensitive material, the mirror having a substrate body, a first mirror surface and a second mirror surface, the first mirror surface being formed on a first side of the substrate body, the second mirror surface being formed on a second side of the substrate body, the second side being different from the first side of the substrate body and the substrate body having a refractive index that varies by at least 1 ppm within the volume of the substrate body. This indication with regard to the variation of the refractive index relates to a wavelength of 633 nm, which is often used as a measurement wavelength in interferometric measurements.

A mirror embodied in this way has the advantage that a multiplicity of suitable materials are available for the embodiment of the substrate body and desired properties of the substrate body can thus be realized through the choice of material.

The refractive index of the substrate body can vary by at least 10 ppm, in particular, within the volume of the substrate body. The indication with regard to the variation of the refractive index once again relates to a wavelength of 633 nm.

Moreover, the invention relates to a mirror of a projection exposure apparatus for microlithography for the structured exposure of a light-sensitive material, the mirror having a substrate body, a first mirror surface and a second mirror surface, the first mirror surface being formed on a first side of the substrate body, the second mirror surface being formed on a second side of the substrate body, said second side being different from the first side of the substrate body, and the mirror having at least one reflective auxiliary surface. The mirror according to the invention preferably has at least three auxiliary surfaces.

A mirror having at least one reflective auxiliary surface has the advantage that the position of the first mirror surface and the position of the second mirror surface can be determined very accurately with a comparatively low outlay.

The mirror can be embodied such that the auxiliary surface reflects light which does not contribute to an exposure of the light-sensitive material. In particular, the auxiliary surface can reflect exclusively light which does not contribute to an exposure of the light-sensitive material. This has the advantage that the auxiliary surface can be optimized for measurement purposes in a manner detached from the requirements of the exposure.

The auxiliary surface can be embodied in a spherical fashion at least in regions. This simplifies possible measurements with the inclusion of the auxiliary surface.

Furthermore, the auxiliary surface can be embodied as a reference relative to which a desired position of the first mirror surface and a desired position of the second mirror surface are predefined. A desired position relative to the first mirror surface can likewise be predefined for the second mirror surface. In this way, the mirror can be specified with high accuracy. As used in the present text, the term "desired position" is synonymous with "setpoint position".

The first mirror surface and/or the second mirror surface can have an actual position that deviates from the desired position by a displacement distance of at most 100 nm and by an angle of rotation of at most 100 nrad. It is likewise possible for the actual position of the first mirror surface and/or the second mirror surface to deviate from the desired position by a displacement distance of a maximum of 10 nm, in particular a maximum of 1 nm, and by an angle of rotation of a maximum of 10 nrad, in particular a maximum of 1 nrad. The embodiment of the mirror surfaces with such high accuracies has the advantage that possible remaining positional deviations can easily be compensated by further components of the projection exposure apparatus or compensation is not necessary at all.

The mirror can be embodied in such a way that the first mirror surface and the second mirror surface reflect light which contributes to an exposure of the light-sensitive material and has a wavelength of less than 100 nm.

The mirror can have exactly two mirror surfaces. However, it is likewise also possible for the mirror to have three or more mirror surfaces.

The first side of the substrate body can be embodied as a front side and the second side of the substrate body can be embodied as a rear side facing away from the front side.

The first mirror surface and the second mirror surface in each case can have a reflectivity for the exposure light upon perpendicular incidence of at least 20%, preferably at least 50%.

Furthermore, the first mirror surface and the second mirror surface can be separated from one another by a region which has a reflectivity for the exposure light upon perpendicular incidence of less than 20%.

The first mirror surface can have a first partial region and the second mirror surface can have a second partial region, which are embodied such that no light beam which is reflected in the first partial region intersects a light beam which is reflected in the second partial region. This means that the first mirror surface and the second mirror surface can be spatially greatly separated from one another.

The first mirror surface and/or the second mirror surface can have a curvature.

The mirror can furthermore be embodied such that the light which contributes to an exposure of the light-sensitive material, after reflection at the first mirror surface, is reflected at least twice before it impinges on the second mirror surface.

The invention furthermore relates to a projection exposure apparatus for microlithography for the structured exposure of a light-sensitive material, wherein the projection exposure apparatus has at least one mirror according to the invention.

The invention furthermore relates to a method for producing a mirror having a substrate body, a first mirror surface and a second mirror surface. In the method according to the invention, the first mirror surface and the second mirror surface are measured interferometrically with regard to their position relative to one another and in the process light is directed onto the first mirror surface directly and light is directed onto the second mirror surface via an additional mirror.

The method according to the invention has the advantage that it makes it possible to realize at least two mirror surfaces, which are oriented very precisely with respect to one another, within a comparatively small structural space. In this case, it is particularly advantageous that the light does not have to pass through the substrate body during the measurement and, consequently, the optical properties of the substrate body are not of importance for the measurement. Accordingly, during the production of the mirror, for the substrate body it is possible to use a material which permits a measurement through the substrate body on account of its optical properties not with high accuracy, in particular not with the accuracy required when using the mirror in a projection exposure apparatus for microlithography. A further advantage is that the first mirror surface and the second mirror surface can be measured without changing the measuring arrangement. In this case, the first mirror surface and the second mirror surface can even be measured simultaneously. In particular, the first mirror surface and the second mirror surface can be produced with a deviation from a position with respect to one another, said position being predefined by an optical design, which corresponds to a displacement by a maximum of 100 nm, in particular a maximum of 10 nm or even a maximum of 1 nm, in combination with a rotation by a maximum of 100 nrad, in particular a maximum of 10 nrad or even a maximum of 1 nrad.

The mirror can be embodied for use in the wavelength range below 100 nm, in particular for a wavelength of 13.6 nm, wherein the reflectivity of the first mirror surface and/or of the second mirror surface in this wavelength range upon perpendicular incidence can be at least 20%, preferably at least 50%.

A processing of the first mirror surface and/or of the second mirror surface can be carried out depending on the result of the measurement of the first mirror surface and of the second mirror surface. The desired precision of the mirror can be reliably achieved in this way. In this case, it is possible firstly to employ an allowance in order to avoid an excessively high material removal. If the desired position of the two mirror surfaces has been reached, only a uniform removal is effected until the mirror surfaces are at the desired distance from one another. However, it is likewise also possible to alleviate or eliminate an impermissibly high degree of material removal by applying material. This can be effected, for example, by growing material from the gas phase.

During the measurement of the first mirror surface and of the second mirror surface light can be focused onto the first mirror surface and/or onto the second mirror surface. In this way, the position of the probed location can be determined with very high precision. Furthermore, during the measurement of the first mirror surface and of the second mirror surface, light can be directed onto the first mirror surface and/or onto the second mirror surface with perpendicular incidence. This allows a very precise measurement of the form of the first and/or second mirror surface. With a combination of the focus measurements and perpendicular incidence, the form and the spatial arrangement of the mirror surfaces can be determined very precisely.

The first mirror surface can be measured using a first set of diffractive structures and the second mirror surface can be measured using a second set of diffractive structures. The diffractive structures can for example in each case be embodied as computer generated holograms, CGH for short. CGHs can be produced with high precision with a tenable outlay for surfaces to be measured that are embodied in virtually any desired fashion.

The first set of diffractive structures and the second set of diffractive structures can be arranged in a defined position relative to one another. In particular, the relative position of the first set of diffractive structures and the second set of diffractive structures is known with an accuracy of better than 10 nm or better than 1 nm relative to one another. This positional accuracy of microstructures is sought, for example, for lithography masks as well.

By way of example, the first set of diffractive structures and the second set of diffractive structures can be arranged together on a common carrier. This has the advantage that the orientation of the diffractive structures with respect to one another is permanently maintained, even when the position of the diffractive structures is changed by a change in the position of the carrier.

It is likewise also possible for the first set of diffractive structures and the second set of diffractive structures to be distributed in each case between two, in particular between in each case the same two carriers. Moreover, there is also the possibility of providing a separate carrier in each case for the first set of diffractive structures and the second set of diffractive structures.

The measurement of the first mirror surface and the measurement of the second mirror surface can be carried out in the same position of the mirror. It is thereby possible to avoid a renewed adjustment or renewed position determination associated with a repositioning of the mirror.

By way of example, the light can be directed onto the first mirror surface with the first diffractive structure and onto the additional mirror with the second diffractive structure.

The additional mirror can be measured with regard to its position relative to the second mirror surface. This can prevent the measurement result from being corrupted by a possible deviation of the additional mirror from a predefined position. The monitoring of the position of the additional mirror is also possible during the measurement of the mirror surfaces of the mirror. The diffractive structures required for this purpose can be accommodated in each case on the same carrier which also has the diffractive structures for the measurement of the mirror surfaces of the mirror.

In one variant of the method according to the invention, for the measurement of the second mirror surface light is directed through a cutout in the mirror. This procedure allows a very compact measuring arrangement.

In a further variant of the method according to the invention, for the measurement of the second mirror surface light is directed around the mirror. This procedure is universally applicable, in particular including in the case of a mirror without a cutout.

The invention is explained in greater detail below on the basis of the exemplary embodiments illustrated in the drawings.

DETAILED DESCRIPTION OF EXEMPLARY EMBODIMENTS

Figure 1:
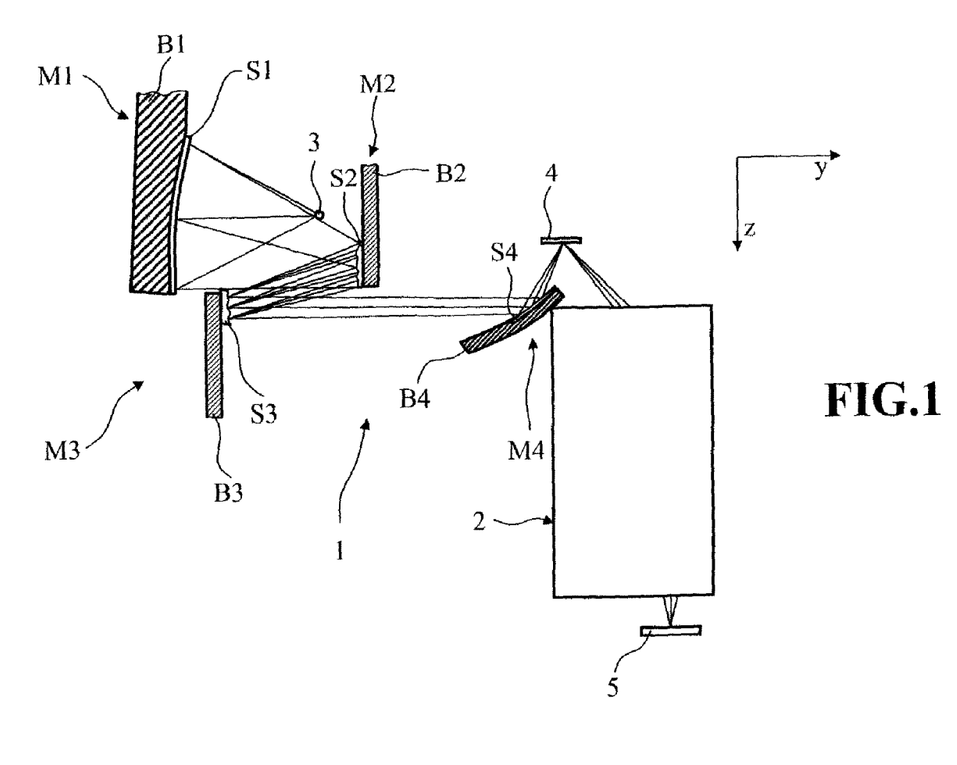
FIG. 1 shows an exemplary embodiment of a projection exposure apparatus for microlithography embodied according to the invention in a schematic illustration.

FIG. 1 shows an exemplary embodiment of a projection exposure apparatus for microlithography embodied according to the invention in a schematic illustration. The projection exposure apparatus has an illumination system 1 and a projection objective 2. In the exemplary embodiment illustrated, the projection exposure apparatus is embodied as a catoptric system and accordingly has exclusively mirrors and no lenses as optical elements.

The illumination system 1 has a light source 3, a mirror M1, a mirror M2, a mirror M3 and a mirror M4. In the exemplary embodiment illustrated, each mirror of the illumination system 1 has a substrate body and a mirror surface embodied on the substrate body, that is to say that the mirror M1 has a substrate body B1 and a mirror surface S1, the mirror M2 has a substrate body B2 and a mirror surface S2, the mirror M3 has a substrate body B3 and a mirror surface S3, and the mirror M4 has a substrate body B4 and a mirror surface S4.

The substrate bodies B1, B2, B3, B4 can consist of a material having a small coefficient of thermal expansion, for example of a glass ceramic material such as Zerodur or ULE. Silicon or silicon carbide, for example, are furthermore suitable as mirror materials. The material of the substrate bodies B1, B2, B3, B4 can have a comparatively high inhomogeneity with regard to the refractive index. In particular, the refractive index can vary in each case by at least 1 ppm (parts per million) or even by at least 10 ppm within the volume of the substrate bodies B1, B2, B3, B4. These indications with regard to the variation of the refractive index in each case relate to a wavelength of 633 nm, which is often used as a measurement wavelength in interferometric measurements. The mirror surfaces S1, S2, S3, S4 can be formed, for example, by a layer stack, in particular by a stack of alternating layers composed of silicon and molybdenum.

The mirror M1 can be embodied, in particular, as a collector mirror having a concave mirror surface S1. The mirrors M2 and M3 can have faceted mirror surfaces S2 and S3. The mirror M4 can be embodied, in particular, as a focusing mirror having a concave mirror surface S4.

The light source 3 is embodied as a plasma source, for example, and generates light in the EUV range having a wavelength that is less than 100 nm. By way of example, the wavelength of the light generated by the light source 3 can be 13.6 nm or 7 nm.

The light generated by the light source 3 is reflected in order by the mirror surface S1 of the mirror M1, the mirror surface S2 of the mirror M2, the mirror surface S3 of the mirror M3 and the mirror surface S4 of the mirror M4 and then impinges on a reticle 4. In this case, the illumination system 1 can be designed such that the reticle 4 is not illuminated over the whole area, rather only over a partial region, which can have for example the form of an annulus or of a segment thereof.

The reticle 4 has a pattern that reflects the impinging light towards the projection objective 2. The pattern of the reticle 4 can represent constituent parts of an integrated circuit, for example.

The projection objective 2 is merely illustrated as a "Black Box" in FIG. 1. The construction of the projection objective will be explained in greater detail with reference to FIG. 2.

The projection objective 2 images the pattern of the reticle 4 onto a light-sensitive material with which a wafer 5 is coated. Accordingly, the wafer 5 is arranged in the beam path downstream of the projection objective 2. The imaging of the pattern onto the light-sensitive material of the wafer 5 can be effected, in particular, in the context of a scanning process in which, in the scanning direction, only a partial region of the pattern to be imaged is illuminated and the reticle 4 and the wafer 5 are moved synchronously relative to the projection objective 2. In order to enable movement that is synchronous with respect to the imaging, the imaging scale of the projection objective 2 is taken into account in the advancing movements of the reticle 4 and of the wafer 5. The advancing movements of the reticle 4 and of the wafer 5 are in each case effected parallel to the y-direction depicted in FIG. 1. The z-direction runs perpendicular to the planes in which the surface of the reticle 4 and the surface of the wafer 5 are arranged.

Figure 2:
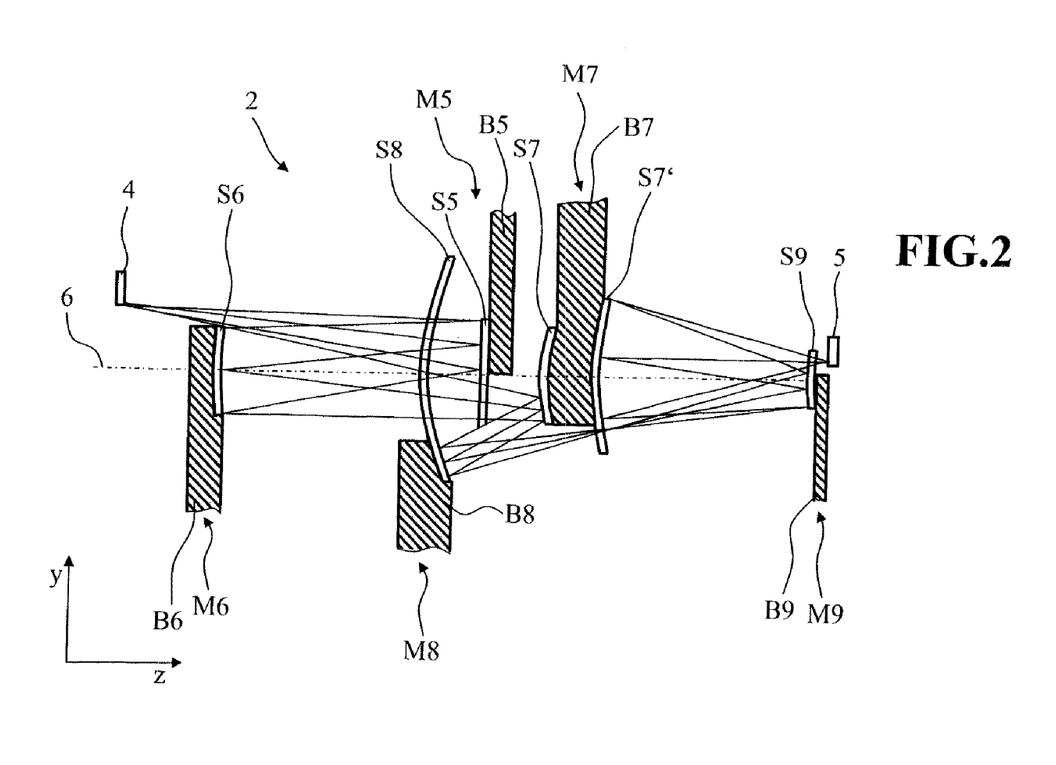
FIG. 2 shows an exemplary embodiment of the projection objective according to the invention in a schematic illustration.

FIG. 2 shows an exemplary embodiment of the projection objective 2 according to the invention in a schematic illustration.

The projection objective 2 has a mirror M5, a mirror M6, a mirror M7, a mirror M8 and a mirror M9, which are arranged one after another proceeding from the reticle 4 in the beam path. The mirror M5 has a substrate body B5 and a virtually plane mirror surface S5, the mirror M6 has a substrate body B6 and a concave mirror surface S6, the mirror M7 has a substrate body B7 and a convex mirror surface S7 and also a concave mirror surface S7'. The mirror M7 therefore has two mirror surfaces S7 and S7' on its substrate body B7, said mirror surfaces being embodied on mutually opposite sides of the substrate body B7. The mirror M8 has a substrate body B8 and a concave mirror surface S8, and the mirror M9 has a substrate body B9 and a convex mirror surface S9.

Accordingly, the light is reflected on its way from the reticle 4 to the wafer 5 in order at the mirror surface S5 of the mirror M5, the mirror surface S6 of the mirror M6, the mirror surface S7 of the mirror M7, the mirror surface S8 of the mirror M8, the mirror surface S9 of the mirror M9 and the mirror surface S7' of the mirror M7.

In the exemplary embodiment illustrated, all the mirror surfaces S5, S6, S7, S7', S8 and S9 are embodied rotationally symmetrically with respect to an optical axis 6 of the projection objective 2 and can have a spherical or an aspherical form. However, the complete solid of revolution does not actually have to be present in each case. Rather, it suffices for the mirror surfaces S5, S6, S7, S7', S8 and S9 actually to be formed where the light which contributes to the exposure of the light-sensitive material of the wafer 5 impinges on the mirror surfaces S5, S6, S7, S7', S8 and S9. No mirror surface S5, S6, S7, S7', S8 and S9 is respectively formed where shading would occur. Otherwise, production engineering considerations and considerations with regard to operation of the projection objective 2 in as optimum a manner as possible are employed as criteria to determine at which locations of the solids of revolution the mirror surfaces S5, S6, S7, S7', S8 and S9 are actually formed and at which locations they are not formed.

As an alternative to rotationally symmetrical mirror surfaces S5, S6, S7, S7', S8 and S9, it is also possible to use mirror surfaces S5, S6, S7, S7', S8 and S9 which have no rotational symmetry and are referred to as free form surfaces. The above explanations concerning the mirror surfaces S5, S6, S7, S7', S8 and S9 embodied in a rotationally symmetrical fashion apply to free form surfaces in an analogous manner, mutatis mutandis. Moreover, the explanations concerning the mirror surfaces S5, S6, S7, S7', S8 and S9 of the projection objective 2 also apply in an analogous manner to the mirror surfaces S1, S2, S3, and S4 of the illumination system. In particular, it is also possible for the illumination system 1 to have a mirror having two mirror surfaces on a common substrate body.

In order to obtain a high imaging quality during the imaging of the pattern of the reticle 4 onto the light-sensitive material of the wafer 5, it is necessary to manufacture the mirror surfaces S5, S6, S7, S7' S8 and S9 of the projection objective 2 with high precision with regard to their shaping and to adjust them with high precision with respect to one another. However, after the production of the mirror M7, it is no longer possible for the mirror surfaces S7 and S7' to be adjusted independently of one another owing to their being embodied jointly on the substrate body B7. The two mirror surfaces S7, S7' can only be adjusted jointly. This means that a misorientation of the two mirror surfaces S7 and S7' relative to one another can no longer be rectified afterwards. It is merely possible to attempt to correct the aberrations resulting from such a misorientation with adjustment operations on the rest of the mirror surfaces S5, S6, S8 and S9. This can be very complicated, however. Moreover, the correction possibilities are limited owing to the relatively small number of mirror surfaces S5, S6, S8 and S9, with the result that the aberrations caused by a misorientation between the mirror surfaces S7 and S7' can generally only be corrected in part.

In order at least to alleviate this problem, measures are taken in the context of the invention to minimize the misorientation between the mirror surfaces S7 and S7' or more generally between two mirror surfaces S and S' which are embodied on a common substrate body B of a mirror M. This is achieved according to one aspect of the invention by virtue of the fact that interferometric measurements that include both mirror surfaces S, S' are carried out and a subsequent processing of the mirror M, in order to reduce the misorientation between the two mirror surfaces S, S', is effected depending on the measurement results.

Such a procedure initially appears to be impossible because interferometric measurement methods which are known for lenses and in which the respective front-side optical surface is optically probed directly and the respective rear-side optical surface is optically probed through the lens cannot be employed in the case of the mirror surfaces S, S'. This is because this would require a measurement through the mirror surface S and the substrate body B, for example. Owing to the lack of transmission in the EUV range, such a measurement would be possible at best at a longer wavelength at which the mirror surface S and the substrate body B are sufficiently transparent, but it would then fail owing to the lack of optical homogeneity of the substrate body B.

Therefore, a different procedure is adopted in the context of the invention. Thus, in accordance with one variant of the invention, auxiliary surfaces are provided on the mirror M and included in the measurements. This is explained in greater detail below with reference to FIGS. 3 to 5.

Figure 6:
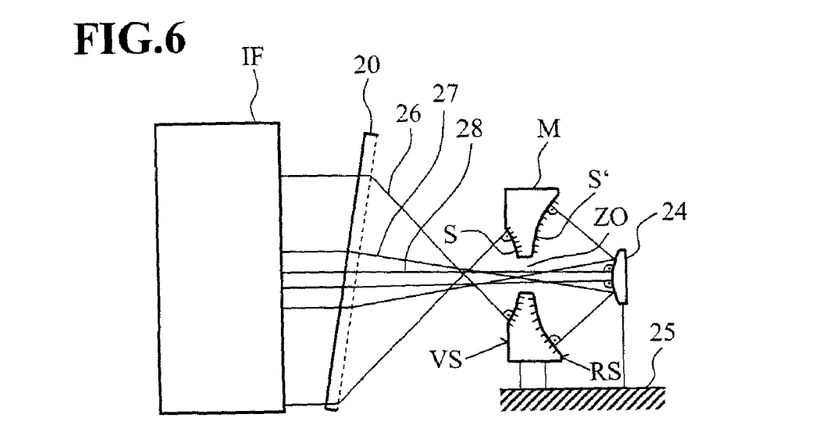
FIG. 6 shows a further exemplary embodiment of the measuring arrangement for measuring the mirror according to the invention while carrying out a first measurement step in a schematic illustration.
Figure 7:
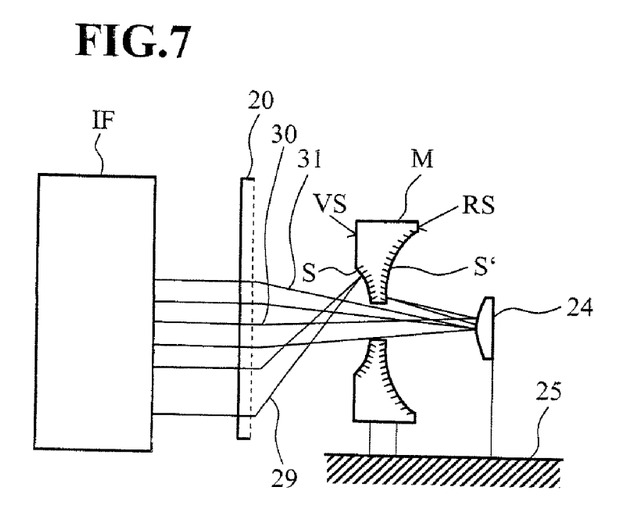
FIG. 7 shows the measuring arrangement from FIG. 6 while carrying out a second measurement step in a schematic illustration.

In a further variant, which is illustrated in FIGS. 6 and 7 and which, in particular, can also be employed in the measurement of obscurated mirrors, surfaces which are not constituent parts of the mirror M to be measured are included in the measurements.

Figure 8:
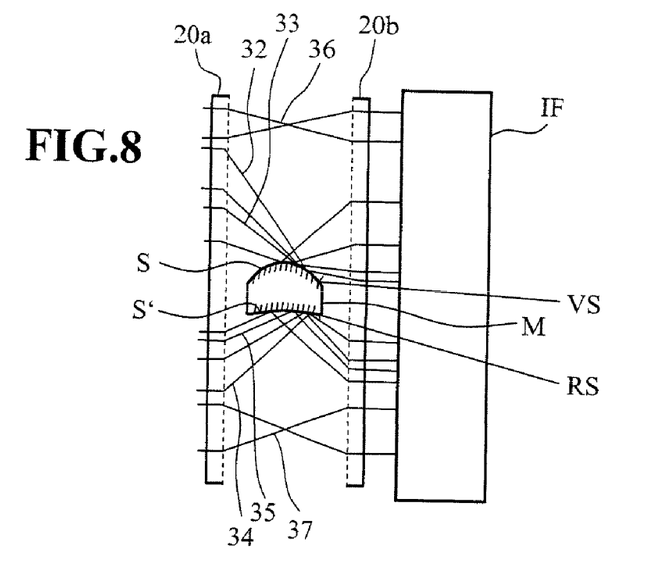
FIG. 8 shows a further exemplary embodiment of the measuring arrangement for measuring the mirror in a schematic illustration.

In a variant illustrated in FIG. 8, none of the additional surfaces mentioned above is required for the measurement of the mirror surfaces S, S'.

Figure 3:
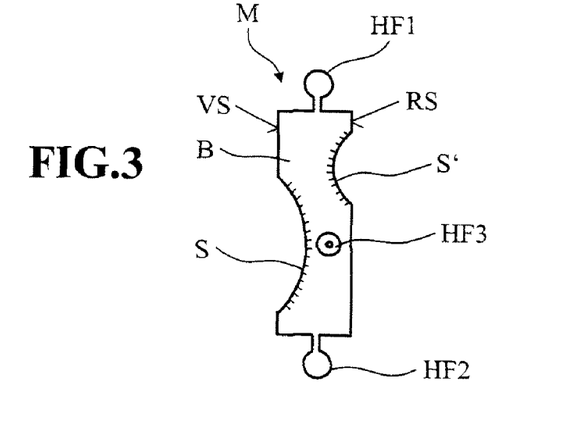
FIG. 3 shows an exemplary embodiment of a mirror embodied according to the invention in a schematic illustration.

FIG. 3 shows an exemplary embodiment of a mirror M embodied according to the invention in a schematic illustration. The mirror M has substrate body B and two mirror surfaces S and S', which are embodied on sides of the substrate body B which face away from one another. For reasons of clarity, that side of the substrate body B on which the mirror surface S is embodied is referred to hereinafter as the front side VS and that side of the substrate body B on which the mirror surface S' is embodied is referred to as the rear side RS.

The mirror M has overall the basic form of a cylinder, wherein the front side VS of the substrate body B with the mirror surface S and the rear side RS of the substrate body B with the mirror surface S' form the base and top of the cylinder. Three auxiliary surfaces HF1, HF2, HF3 embodied in a spherical fashion are arranged on the substrate body B in a manner distributed over the circumference of the lateral surface of the cylinder. The auxiliary surfaces HF1, HF2, HF3 are shaped very precisely and embodied in a reflective fashion. In this embodiment of the method according to the invention, which will be described in even greater detail below, what is primarily of importance is more the precision in shaping i.e. a smallest possible deviation from a spherical form rather than the absolute size, i.e. the radius of the sphere. In particular, the auxiliary surfaces HF1, HF2, HF3 can be produced from the same materials as the mirror surfaces S and S' and can accordingly have similar reflection properties.

Given suitable embodiment of the mirror surfaces S and S' the mirror M illustrated in FIG. 3 can be used for example as mirror M7 of the projection objective 2 illustrated in FIG. 2.

The measurement of the mirror surfaces S and S' of the mirror M with the inclusion of the auxiliary surfaces HF1, HF2, HF3 will be explained with reference to FIGS. 4 and 5.

Figure 4:
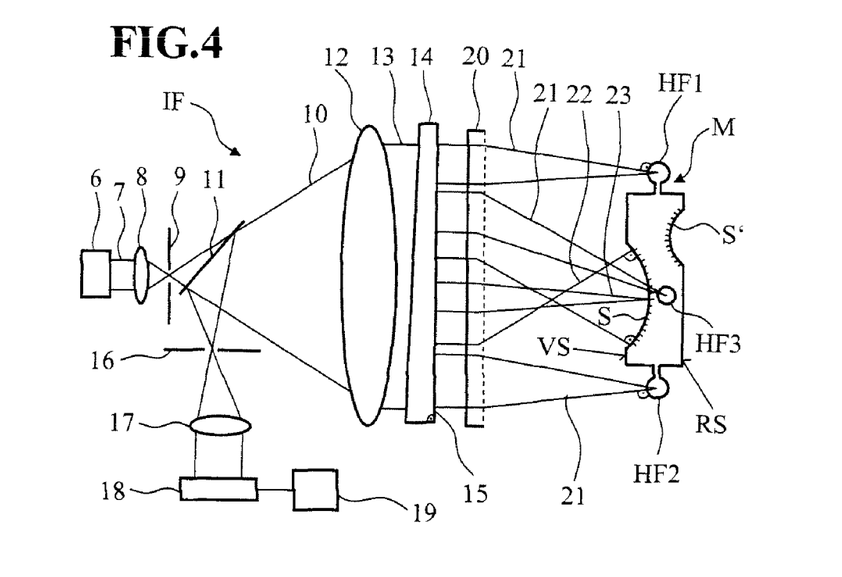
FIG. 4 shows an exemplary embodiment of a measuring arrangement for measuring the mirror according to the invention while carrying out a first measurement step in a schematic illustration.

FIG. 4 shows an exemplary embodiment of a measuring arrangement for measuring the mirror M while carrying out a first measurement step in a schematic illustration. The measurement is carried out with the aid of an interferometer IF, which is embodied as a Fizeau interferometer, for example, in the following manner:

Using a measurement light source 6, which is embodied as a helium-neon laser, for example, parallel light beams 7 are generated. The parallel light beams 7 impinge on a lens 8, which focuses the light beams 7 onto a spatial filter 9. Instead of the lens 8, it is also possible to provide an objective for the focusing of the light beams 7. The spatial filter 9 is embodied as a pinhole, for example, and generates a bundle of divergent light beams 10 having a spherical wave front. Differently embodied spatial filters 9 can also be used instead of a pinhole. The divergent light beams 10 pass through a beam splitter 11 and then impinge on a collimator lens 12. The collimator lens 12 generates parallel light beams 13 having a planar wave front from the divergent light beams 10. The parallel light beams 13 pass through a wedge-shaped plate 14 and emerge from the wedge-shaped plate 14 perpendicularly through a planar surface 15.

The planar surface 15 is embodied such that it is partly transmissive and accordingly reflects some of the parallel light beams 13 back on themselves. The light beams reflected back pass through the wedge-shaped plate 14 again are focused by the collimator lens 12 and then deflected by the beam splitter 11 in the direction of a spatial filter 16. After passing through the spatial filter 16, the light beams reflected back impinge on a camera objective 17 and then on a spatially resolving detector 18 which can be embodied as a CCD chip, for example. Evaluation electronics 19 are connected to the spatially resolving detector 18.

The light beams emerging from the planar surface 15 of the wedge-shaped plate 14 impinge on a CGH arrangement 20. The CGH arrangement 20 has a plurality of diffractive structures (not illustrated pictorially), in particular computer generated holograms, abbreviated to CGH, which are arranged on a common carrier, and generates a series of test beams. Test beams 21 generated by the CGH arrangement 20 are directed onto the auxiliary surfaces HF1, HF2, HF3 of the mirror M. The test beams 21 impinge with perpendicular incidence on the auxiliary surfaces HF1, HF2, HF3 of the mirror M and are accordingly reflected back on themselves. Furthermore, the CGH arrangement 20 generates test beams 22 which impinge perpendicularly on the mirror surface S on the front side VS of the mirror M and are reflected back on themselves. Finally, the CGH arrangement 20 generates test beams 23 which are focused onto the mirror surface S on the front side VS of the mirror M and are reflected back from the mirror surface S to the CGH arrangement 20.

All of the test beams reflected back pass through the CGH arrangement 20, the wedge-shaped plate 14 and the collimator lens 12 and are then deflected by the beams splitter 11 to the spatial filter 16. After passing through the spatial filter 16 and the camera objective 17, the test beams reflected back impinge on the spatially resolving detector 18, where the test beams reflected back respectively interfere with the light beams reflected back at the planar surface 15 of the wedge-shaped plate 14, which serve as reference beams. In this way, a series of interferrograms is generated which are respectively detected by the spatially resolving detector 18 and analyzed by the evaluation electronics 19.

The interferrograms generated with the test beams 21 can be used for an exact position determination of the auxiliary surfaces HF1, HF2, HF3. The auxiliary surfaces HF1, HF2, HF3 are embodied in a spherical fashion with high precision. Consequently, their surface form and thus their influence on the test beams 21 is known very accurately. Since the reflection of the test beams 21 at the auxiliary surfaces HF1, HF2, HF3 depends on the surface form and the position of the auxiliary surfaces HF1, HF2, HF3, the position of the auxiliary surfaces HF1, HF2, HF3 can in each case be determined from the interferrograms generated with the test beams 21. As a result, it is possible, for example, to arrange the auxiliary surfaces HF1, HF2, HF3 with high precision at predefined positions, which however, have to be compatible with the constraint predefined by the rigid connection of the auxiliary surfaces HF1, HF2, HF3. In this way the position of the mirror M is defined overall with a high precision. A rough prepositioning of the auxiliary surfaces HF1, HF2, HF3 can be effected with tactile measurements or in some other way. Even for the case where no exact positioning of the auxiliary surface HF1, HF2, HF3 at predefined locations is performed, the actual position thereof and consequently, also the actual position of the mirror M are known with high accuracy.

After the above-described precise orientation or position determination of the mirror M, the form and position of the mirror surface S are measured with the aid of the test beams 22 and 23. For this purpose, interferograms generated by the interference of the test beams 22 and 23 reflected back at the mirror surface S with the light beams reflected back at the planar surface 15 of the wedge-shaped plate 14 are evaluated. From the interferograms of the test beams 22 reflected back the form deviation of the mirror surface S from a desired form encoded into the CGH arrangement 20 can be determined in a manner known per se. However, this determination is not unambiguous insofar as it yields the same result for similar surfaces, i.e. for surfaces which can be transformed into one another by propagation along the normal directions in respect of the surface. Therefore, the test beams 23 are additionally evaluated. From the interferograms of the test beams 23 reflected back, it is possible to determine, in a manner known per se, the degree of defocusing of the test beams 23 on the mirror surface S and hence the distance between the irradiated region of the mirror surface S and the CGH arrangement 20. The distance determination is based the fact that the CGH arrangement 20 focuses the test beams 23 in a defined manner, that is to say that the position of the focus relative to the CGH arrangement 20 is known accurately.

Since the measurement of the mirror surface S on the front side VS of the mirror M is carried out using the same CGH arrangement 20 as the measurement of the auxiliary surfaces HF1, HF2, HF3, it is possible in the manner described above, to measure the mirror surface S relative to a system of coordinates defined by the auxiliary surfaces HF1, HF2, HF3.

After the measurement of the mirror surface S, the CGH arrangement 20 is replaced by a CGH arrangement 20 having diffractive structures for measuring the mirror surface S' and for probing the auxiliary surfaces HF1, HF2, HF3. Moreover, the mirror M is positioned such that the mirror surface S' faces the CGH arrangement 20. This can be achieved for example, by rotating the mirror M by 180° about an axis that runs parallel to the surface of the CGH arrangement 20. The measurement of the mirror surface S' of the mirror M repositioned in this way will be explained with reference to FIG. 5.

It is likewise also possible to carry out the measurement of the mirror surface S and the measurement of the mirror surface S' using the same CGH arrangement 20. In this case, the CGH arrangement 20 has diffractive structures for the measurement of the mirror surface S and diffractive structures for the measurement of the mirror surface S' and care should be taken to ensure that the diffractive structures required in each case are illuminated. This can be achieved for example by partially masking out the light.

Figure 5:
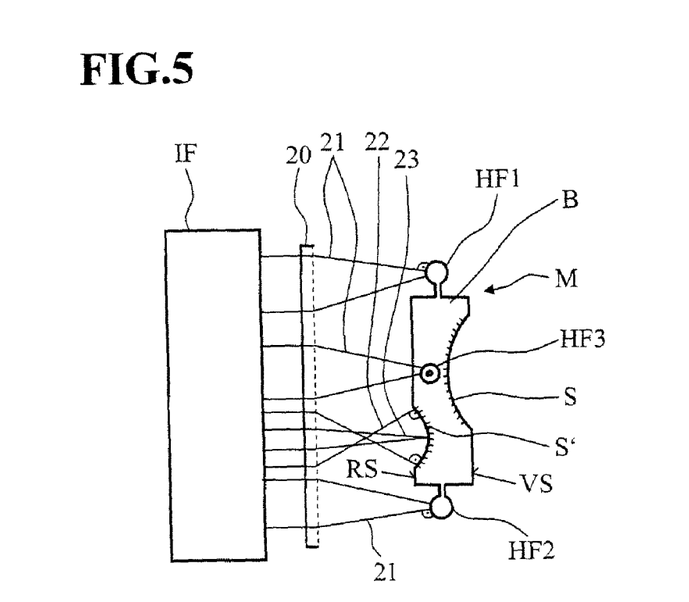
FIG. 5 shows the measuring arrangement from FIG. 4 while carrying out a second measurement step in a schematic illustration.

FIG. 5 shows the measuring arrangement from FIG. 4 while carrying out a second measurement step in a schematic illustration. In FIG. 5, the interferometer IF is merely illustrated as a "Black Box" since its internal construction is unchanged with respect to FIG. 4. Apart from the interferometer IF, the CGH arrangement 20 and the mirror M to be measured are illustrated in FIG. 5. During the second measurement step illustrated in FIG. 5, the measuring arrangement is maintained virtually unchanged with respect to FIG. 4. Merely the orientation of the mirror M with respect to the CGH arrangement 20 is changed compared with the first measurement step illustrated in FIG. 4, such that the rear side RS of the mirror M is accessible for the measurement. In addition, depending on the embodiment variant, if appropriate the CGH arrangement 20 is replaced by a CGH arrangement 20 having other diffractive structures or care is taken to ensure that other diffractive structures of the CGH arrangement 20 are illuminated.

In a manner identical to that in the first measurement step, in the second measurement step the mirror M is firstly oriented with high accuracy with the aid of the auxiliary surfaces HF1, HF2, HF3, or the actual position of the auxiliary surfaces HF1, HF2, HF3 and hence also the actual position of the mirror M are determined with high accuracy. Consequently, the same system of coordinates which was also used in the first measurement step is available for the second measurement step.

Next, the mirror surface S' is measured analogously to the way in which this was effected with the mirror surface S in the first measurement step. After the second measurement step has been carried out, the form of the mirror surface S and the form of the mirror surface S' are known with high precision. Moreover, the position of the mirror surface S and the position of the mirror surface S' in each case relative to the auxiliary surfaces HF1, HF2, HF3 and hence also relative to one another are known with high precision.

As already explained, during the two measurement steps, it is possible in each case to dispense with an exact positioning of the auxiliary surfaces HF1, HF2, HF3 and instead merely to determine the positions thereof. In this case, however, the position deviations of the auxiliary surfaces HF1, HF2, HF3 between the first measurement step and the second measurement step in each case have to be taken into account when determining the position of the mirror surfaces S and S' with respect to one another.

In the context of the production of the mirror M the mirror surfaces S, S', formed using known processing techniques such as grinding, polishing or coating methods, for example, are tested and reworked, if appropriate, at least once with the above-described measuring method or a variant described below or some other variant. Processing techniques known per se can be used during the reworking.

The measurement and reworking of the mirror M are repeated until both the form of the mirror surfaces S, S' and the position of the mirror surfaces S or S' with respect to one another deviate from a desired form and a desired position at most by a permissible tolerance. In order to achieve this, the mirror surface S, S' which does not yet lie within the tolerance with regard to its form is respectively reworked. A positional deviation between the two mirror surfaces S, S' can optionally be corrected by subsequent processing of the mirror surface S, by subsequent processing of the of the mirror surface S' or by subsequent processing of both mirror surfaces S, S'. The selection of the mirror surface S, S' to be reworked for the correction of the positional deviation can be coupled to the requirements for correcting the form deviation. By way of example, the mirror surface S or S' which would have to be reworked anyway in order to correct the form deviation can be used for the correction of the positional deviation. It can likewise be attempted to limit the reworking for the positional deviation to the extent of the subsequent processing of the respective mirror surface S, S' that is necessary for the correction of the form deviation. This procedure is appropriate particularly when both mirror surfaces S, S' have to be reworked in order to correct the form deviation and it is necessary to decide how the correction of the positional deviation ought to be distributed between the two mirror surfaces S, S'.

In order to avoid an excessively high material removal, which cannot be reversed or can only be reversed with great complexity, an allowance can be employed at the outset. If the desired form and position of the two mirror surfaces S, S' have been reached, then only a uniform removal is effected until the mirror surfaces are at the desired distance from one another. However, it is also possible to alleviate or eliminate an impermissibly high extent of the material removal by applying material. This can be effected, for example, by growing material from the gas phase.

In the manner outlined, the mirror M can be produced in such a way that the mirror surfaces S, S' in each case have a form embodied in a highly precise fashion and are oriented with high precision relative to one another, where the orientation with respect to one another encompasses not only the angular orientation but also the distance from one another. In particular, the mirror M can be produced with precision that allows the mirror M to be used in a projection exposure apparatus.

Mirrors having three or more mirror surfaces can also be produced in an analogous manner.

The precision of the mirror surface S and of the mirror surface S' with regard to the form can in each case be expressed by the deviation of the actual form from a desired form. In order to determine concrete numerical values, the form deviation can be defined as a root-mean-square value F_RMS, which can be calculated in the following way:

$$F\_RMS = \sqrt{\frac{1}{n}\sum_{i=1}^{n} z_i^2}$$

In this case, $z_i$ represents for a support point i the deviation between an actual value and a desired value. The number of support points i is designated as n.

When determining the value F_RMS care should be taken to ensure that the support point density is coordinated with the maximum gradient of the form of the mirror surfaces S, S' in order that the value F_RMS is accorded a highest possible meaningfulness. A correspondingly high support point density should be provided in the case of high gradients.

The permissible tolerance with regard to the form of the mirror surfaces S, S' can be expressed by an upper limits for the value F_RMS which must not be exceeded. As an upper limit for the value F_RMS, by way of example, values of 1 nm or 0.1 nm can in each case be predefined for both mirror surfaces F and F'.

Depending on the requirements of the application, identical or different upper limits for the value F_RMS can be predefined for both mirror surfaces S and S'.

The value F_RMS contains exclusively contributions which result from a deviation from the desired form. Deviations from the desired position do not influence the value F_RMS. This separation can be achieved by performing an fit of the desired form to the actual form before the value F_RMS is determined, and thereby eliminating influences of the position, that is to say that the position is used as a fit parameter.

The position of the mirror surfaces S, S' can in each case be defined by three spatial coordinates and three angles. Accordingly, a positional deviation can be described in each case by three difference values of the coordinates and three difference values of the angles, which can in each case be determined by a comparison of the desired values and the actual values determined in the course of the fit of the form. In this case, the desired values can be predefined relative to any system of coordinates, which can be defined for example with the aid of the auxiliary surfaces HF1, HF2, HF3. From the respective three difference values of the spatial coordinates it is possible to calculate a respective displacement distance and from the respective three difference values of the angles it is possible to calculate a respective angle of rotation which in combination characterize the positional deviation. This means that, through a combination of a single displacement by the displacement distance and single rotation by the angle of rotation, a transition from the actual position to the desired position is effected. In this case, the displacement should be carried out along the direction of a displacement vector, as the absolute value of which the displacement distance was determined. The rotation should be carried out with respect to an axis of rotation which can be determined from the difference values of the angles in a manner known per se.

In the manner described, the positional deviation between the actual position and the desired position can be quantitatively detected in each case for the mirror surface S and for the mirror surface S'. Since, in particular, the relative position of the mirror surfaces S and S' with respect to one another is of importance in many cases, it is expedient to determine the positional deviation of the mirror surface S and of the mirror surface S' relative to one another instead of or in addition to the positional deviation of the mirror surface S and the positional deviation of the mirror surface S'. This is possible, for example, by choosing the system of coordinates such that, for one of the mirror surfaces S or S', the actual position coincides with the desired position. The deviation of the actual position of the other mirror surface S or S' in the same system of coordinates then corresponds to the relative positional deviation. The permissible tolerance with regard to the relative positional deviation of the mirror surfaces S and S' can be expressed by upper limits for the displacement distance and for the angle of rotation. By way of example, 100 nm, 10 nm or 1 nm can be predefined as an upper limit for the displacement distances. By way of example 100 mrad, 10 mrad or 1 mrad can be predefined as an upper limit for the angle of rotation. This means that the permissible tolerances for the form deviations are generally significantly lower than the permissible tolerances for the positional deviation.

As an alternative to the displacement distance, by way of example, it is also possible to use the difference values of the spatial coordinates for the assessment of the positional deviation. In an analogous manner, the difference values of the angles can be used instead of the angle of rotation. In order to reduce the numerical data, there is the possibility in this case, for example, of respectively evaluating only the maximum value. This evaluation can in turn be effected using comparison with upper limits, which can have the orders of magnitude already mentioned. In this variant, too, the relative positional deviation of the mirror surfaces S and S' is of interest, in particular.

As an alternative to the exemplary embodiments of the measuring arrangement as illustrated in FIGS. 4 and 5, differently constructed exemplary embodiments of the measuring arrangement can also be used in the production of the mirror M. This will be explained below with reference to FIGS. 6 to 8.

FIG. 6 shows a further exemplary embodiment of the measuring arrangement for measuring the mirror while carrying out a first measurement step in a schematic illustration. Analogously to FIG. 4, the measuring arrangement illustrated in FIG. 6 has the interferometer IF, the CGH arrangement 20 and the mirror M. Differences with respect to the exemplary embodiment in FIG. 4 consist in a different embodiment of the mirror M and in an additional component in the form of an additional mirror 24, which is mounted together with the mirror M in a common mount 25. In contrast to FIG. 4, the mirror M in accordance with FIG. 6 has no auxiliary surfaces HF1, HF2, HF3. A further difference consists in the fact that the mirror M illustrated in FIG. 6 has a central cutout ZO, through which light can pass. Moreover, the CGH arrangement 20 is illustrated in a tilted fashion in FIG. 6 in order to indicate that, for example, the light beams from and to the interferometer IF do not have to be oriented perpendicular to the CGH arrangement 20. A tilting of the CGH arrangement 20 can even be advantageous with regard to avoiding disturbing reflections. It goes without saying that the CGH arrangement 20 can also be employed without tilting in the measuring arrangement in FIG. 6. In order to indicate this, the CGH arrangement 20 is illustrated without tilting in FIG. 7, which otherwise shows the same measuring arrangement.

Test beams 26 coming from the CGH arrangement 20 impinge perpendicularly on the mirror surface S on the front side VS of the mirror M and are reflected back on themselves, that is to say that they pass through the CGH arrangement 20 and then enter the interferometer IF. Said test beams 26 are used for determining the form of the mirror surface S.

Furthermore, test beams 27 are illustrated in FIG. 6, which test beams, coming from the CGH arrangement 20, pass through the cutout ZO in the mirror M and then impinge on the additional mirror 24. The additional mirror 24 reflects the test beams 27 in the direction of mirror M in such a way that they impinge perpendicularly on the mirror surface S' on the rear side RS of the mirror M. For this purpose, the additional mirror 24 has a curved surface. The test beams 27 impinging on the mirror surface S' on the rear side RS of the mirror M are reflected back on themselves, thus giving rise to renewed reflection at the additional mirror 24 and then to passage through the cutout ZO in the mirror M. The test beams 27 then pass through the CGH arrangement 20 and enter the interferometer IF. With the aid of the interferometer IF, the form of the mirror surface S' is determined from the test beams 27.

Finally, a third type of test beams 28 is illustrated in FIG. 6, which test beams, coming from the CGH arrangement, pass through the cutout ZO in the mirror M and then impinge with perpendicular incidence on the additional mirror 24 and are reflected back on themselves by the latter. The test beams 28 reflected back pass through the cutout ZO in the mirror M to the CGH arrangement 20 and then into the interferometer IF. With the aid of the interferometer IF, the form of the surface of the additional mirror 24 can be determined from the test beams 28. If the form of the surface of the additional mirror 24 is already known with sufficient accuracy, the test beams 28 are not required.

In addition to the determination of the form of the mirror surfaces S, S' of the mirror M, a determination of the position of the mirror surfaces S, S' is carried out. This will be explained with reference to FIG. 7.

FIG. 7 shows the exemplary embodiment—illustrated in FIG. 6—of the measuring arrangement for measuring the mirror M while carrying out a second measurement step in a schematic illustration. With the exception of the CGH arrangement 20, the components illustrated correspond to FIG. 6. Only the beam paths deviate from FIG. 6. This is achieved by virtue of the fact that the CGH arrangement 20 has differently embodied diffractive structures compared with the measuring arrangement in FIG. 6. A further difference consists in the fact that the CGH arrangement 20 in accordance with FIG. 7 is not tilted. However, it is also possible analogously to FIG. 7 to provide a tilting of the CGH arrangement 20.

Test beams 29 are illustrated in FIG. 7, which test beams coming from the CGH arrangement 20, are focused onto the mirror surface S on the front side of the mirror M. Test beams 30 are additionally illustrated, which, coming from the CGH arrangement 20, pass through the cutout ZO in the mirror M and then are reflected by the additional mirror 24 in the direction of the mirror surface S' on the rear side RS of the mirror M and impinge on the mirror surface S' at the focus.

Finally test beams 31 are also illustrated in FIG. 7, which test beams, coming from the CGH arrangement 20, pass through the cutout ZO in the mirror M and are focused onto the additional mirror 24.

All of the test beams 29, 30, 31 illustrated in FIG. 7 respectively make it possible to determine the distance between the CGH arrangement 20 and the impingement region on the surface respectively probed. Together with the information determined in accordance with FIG. 6 concerning the form of the probed surfaces, it is possible to determine the position of the mirror surfaces S and S' on the front side VS and on the rear side RS of the mirror M relative to one another.

The procedure in the case of the measuring arrangement illustrated in FIGS. 6 and 7 differs from the procedure in accordance with FIGS. 4 and 5 insofar as both mirror surfaces S, S' on the front side VS and on the rear side RS of the mirror are measured in an areal fashion in the first measurement step and both mirror surfaces S, S' are measured with focus in the second measurement step. In the case of the measuring arrangement illustrated in FIGS. 4 and 5, the mirror surface S on the front side VS of the mirror M is measured in an areal fashion and with focus in the first measurement step and the mirror surface S' on the rear side RS of the mirror M is measured in an areal fashion and with focus in the second measurement step.

As an alternative to the illustration in FIGS. 6 and 7 it is also possible, in principle, to direct the test beams 27, 30 around the mirror M to the mirror surface S' on the rear side RS of the mirror M. This variant can, in particular, also be employed in the case of mirrors M that do not have a central cutout ZO. In this variant, too, the additional mirror 24 can be used in order to make all required points of the mirror M accessible.

Moreover, there is the possibility of combining the first measurement step and the second measurement step to form a common measurement step, since, between the two measurement steps, it is not necessary to change the measuring arrangement if the CGH arrangement 20 is equipped with all the diffractive structures which are necessary for the measurements of the first measurement step and of the second measurement step. In this case, it is also possible, in particular, to perform all of the measurements simultaneously.

It is likewise possible to carry out the areal measurements of the first measurement step and to delete the second measurement step with the focus measurements. In this case, the distance information that can be determined by means of the second measurements step is obtained in some other way. By way of example, the required distance information can be determined with the aid of a laser distance measuring device in as much as this is permitted by the accuracy requirements.

FIG. 8 shows a further exemplary embodiment of the measuring arrangement for measuring the mirror M in a schematic illustration. The measuring arrangement illustrated in FIG. 8 is distinguished by the fact that the diffractive structures of the CGH arrangement 20 are arranged on two carriers, that is to say that the CGH arrangement 20 has a component 20a and a component 20b.

The component 20a of the CGH arrangement 20 generates a series of test beams 32, 33, 34, 35, 36, 37 from a plane wave which, in the illustration in FIG. 8, impinges on the component 20a of the CGH arrangement 20 from the left. The plane wave can be generated in a manner similar to that illustrated in FIG. 4.

The test beams 32, 33, 34, 35 are reflected at the mirror M and then impinge on the component 20b of the CGH arrangement 20. In this case, the test beam 32 is reflected at the focus and the test beam 33 is reflected in an areal fashion at the mirror surface S on the front side VS of the mirror M. The test beam 34 is reflected at the focus and the test beam 35 is reflected in an areal fashion at the mirror surface S' on the rear side RS of the mirror M.

The test beams 36, 37 pass directly, that is to say without reflection at the mirror M, to the component 20b of the CGH arrangement 20 and serve for the distance determination and hence the positioning of the components 20a and 20b of the CGH arrangement 20 relative to one another.

After passing through the component 20b of the CGH arrangement 20, the test beams 32, 33, 34, 35, 36, 37 are fed to the interferometer IF. Reference beams (not illustrated pictorially) can be coupled out from the plane wave upstream of the component 20a of the CGH arrangement 20, deflected around the CGH arrangement 20 and the mirror M and then fed to the interferometer IF. The interferometer IF can be constructed analogously to FIG. 4, although the beam-generated components are omitted since the latter are arranged adjacent to the component 20b of the CGH arrangement 20.

In a manner similar to that in the previous exemplary embodiments, in FIG. 8, too, the test beams 33, 35 reflected in an areal fashion are used for determining the form of the mirror surfaces S and S'. By adding the test beams 32, 34 reflected at the focus, a position determination of the mirror surfaces S and S' relative to one another is then possible. One difference with respect to the previous exemplary embodiments, however, is that the test beams 32, 33, 34, 35 do not impinge perpendicularly or symmetrically on the mirror surfaces S, S' and, consequently, are not reflected back on themselves or into one another.

The processing of the mirror M on the basis of the measurement results can then be effected in a manner analogous to that already described.

The above description of various embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A mirror of a projection exposure apparatus for microlithography, comprising:
a substrate body having a first mirror surface and a second mirror surface, wherein
the first mirror surface is formed on a first side of the substrate body,
the second mirror surface is formed on a second side of the substrate body, the second side being different from the first side of the substrate body,
the first mirror surface and the second mirror surface are both embodied to reflect light directed for structured exposure onto a light-sensitive material and impinging onto the substrate body from outside the substrate body, and
the substrate body is produced from a glass ceramic material, and
a further mirror surface forming an auxiliary surface.

2. The mirror according to claim 1, wherein the auxiliary surface is positioned and configured to reflect light that does not contribute to the structured exposure of the light-sensitive material.

3. The mirror according to claim 1, wherein the auxiliary surface is spherical at least in regions of the auxiliary surface.

* * * * *

UNITED STATES PATENT AND TRADEMARK OFFICE
CERTIFICATE OF CORRECTION

PATENT NO. : 9,606,339 B2
APPLICATION NO. : 13/367116
DATED : March 28, 2017
INVENTOR(S) : Jochen Hetzler et al.

Page 1 of 1

It is certified that error appears in the above-identified patent and that said Letters Patent is hereby corrected as shown below:

In the Specification

Column 11, Line 21, Delete "interferrograms" and insert -- interferograms --, therefor.

Column 11, Line 24, Delete "interferrograms" and insert -- interferograms --, therefor.

Column 11, Line 34, Delete "interferrograms" and insert -- interferograms --, therefor.

Column 13, Line 28, After "processing of the" delete "of the".

Signed and Sealed this
Twenty-first Day of May, 2019

Andrei Iancu
*Director of the United States Patent and Trademark Office*